(12) United States Patent
Oshima

(10) Patent No.: US 7,196,534 B2
(45) Date of Patent: Mar. 27, 2007

(54) SEMICONDUCTOR TEST INSTRUMENT

(75) Inventor: Hideyuki Oshima, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/538,901

(22) PCT Filed: Dec. 18, 2003

(86) PCT No.: PCT/JP03/16218

§ 371 (c)(1),
(2), (4) Date: Jun. 14, 2005

(87) PCT Pub. No.: WO2004/057354

PCT Pub. Date: Jul. 8, 2004

(65) Prior Publication Data
US 2006/0156126 A1 Jul. 13, 2006

(30) Foreign Application Priority Data
Dec. 20, 2002 (JP) ............................. 2002-370634

(51) Int. Cl.
G01R 31/28 (2006.01)
G06F 11/00 (2006.01)

(52) U.S. Cl. ..................... 324/765; 714/744
(58) Field of Classification Search ..................... None
See application file for complete search history.

(56) References Cited
U.S. PATENT DOCUMENTS 4,876,655 A 10/1989 Carlton et al.
6,789,224 B2 * 9/2004 Miura ......................... 714/744
6,865,698 B2 * 3/2005 Housako ..................... 714/700
6,892,333 B2 * 5/2005 Ohtaki et al. ............... 714/700
7,078,889 B2 * 7/2006 Oshima .................... 324/158.1
7,100,099 B2 * 8/2006 Niijima ....................... 714/744
7,107,166 B2 * 9/2006 Kantake ....................... 702/78
7,126,366 B2 * 10/2006 Ohashi et al. ............... 324/765

FOREIGN PATENT DOCUMENTS

| JP | 01-164118 | 6/1989 |
|---|---|---|
| JP | 2000-314767 | 11/2000 |
| WO | WO 97/04327 | 2/1997 |

* cited by examiner

Primary Examiner—Ernest Karlsen
(74) Attorney, Agent, or Firm—Muramatsu & Associates

(57) ABSTRACT

Output data of a device under test (DUT) is obtained at timing of both rising and falling edges of a clock output from the DUT, and output data of a DDR type device is fetched in synchronization with the clock. A semiconductor test apparatus comprises a clock side time interpolator 20 which obtains clocks input from a DUT 1 by a plurality of strobes of constant timing intervals and which outputs the clocks as time-sequential level data, a data side time interpolator 20 which obtains output data input from the DUT 1 by a plurality of strobes of constant timing intervals and which outputs the output data as time-sequential level data, and an edge selector 30 which switches the time-sequential level data obtained by the time interpolators 20 and selectively outputs level data indicating rising and/or falling edges of the level data.

9 Claims, 9 Drawing Sheets (a)

(b)

(a)

(b)

SEMICONDUCTOR TEST INSTRUMENT

RELATED APPLICATIONS

This application is a 371 of PCT/JP03/16218 filed Dec. 18, 2003 and claims priority from Japanese Patent Application No. JP 2002-370634 filed Dec. 20, 2002.

TECHNICAL FIELD

The present invention relates to a semiconductor test apparatus which determines a pass/failure of a device under test by comparing output data output from the device under test with predetermined expectation value data. More particularly, the invention relates to a semiconductor test apparatus which comprises a source synchronous circuit capable of obtaining clocks and output data output from a device under test as time-sequential level data and fetching the output data of the device under test at timing of a rising edge, a falling edge or both rising and falling edges of a clock signal output from the device under test, and which is accordingly capable of fetching the output data at a signal changing point synchronized with jitters of the device, thereby obtaining an accurate testing result irrespective of jitters, and especially suitable for testing a DDR type device from which data is output at both rising and falling edges of a clock as data rates.

BACKGROUND ART

Generally, a semiconductor test apparatus (LSI tester) that tests a semiconductor device detects or determines a pass/failure of a device under test by inputting a predetermined test pattern signal to the device under test (DUT) as a testing target, and comparing output data output from the device under test with a predetermined expectation value pattern signal to determine coincidence/non-coincidence thereof.

Referring to FIG. 8, a semiconductor test apparatus of this type will be described. FIG. 8 is a block diagram showing a schematic configuration of a conventional general semiconductor test apparatus (LSI tester).

As shown, a conventional LSI tester 110 comprises a level comparator 111 for comparing output data of a device under test (DUT) 101 with a comparison voltage in level, a pattern comparator 112 for comparing the output data of the DUT 101 with a predetermined expectation value, and a flip-flop 121 for inputting the output data of the DUT 101 to the pattern comparator 112 by predetermined timing.

In the conventional LSI tester 110 thus configured, a predetermined test pattern signal is input from a pattern generator (not shown) to the DUT 101, and a predetermined signal is output as output data from the DUT 101. The output data output from the DUT 101 is input to the level comparator 111.

The output data that has been input to the level comparator 111 is compared with the comparison voltage in level, and output to the flip-flop 121.

The flip-flop 121 holds a signal from the level comparator 111 as input data, and outputs output data by predetermined timing using a strobe from a timing generator (not shown) as a clock signal.

The output data output from the flip-flop 121 is input to the pattern comparator 112, and compared with predetermined expectation value data output from the pattern generator in the tester, and a result of the comparison is output.

Then, based on the result of the comparison, coincidence/non-coincidence between the output data and the expectation value is detected, and a pass/failure (Pass/Fail) of the DUT 101 is determined.

Thus, in the conventional LSI tester, the output data output from the device under test is fetched at timing of a strobe output at timing predetermined in the tester, and the output timing of the strobe is fixed. However, the output data of the device under test has jitters (irregular fluctuation of timing). In consequence, a value of the output data obtained by the fixed timing of the strobe is not constant even in the case of the same data, causing a problem of impossibility of obtaining an accurate testing result.

Referring to FIGS. 9(a) and 9(b), such a fluctuation in obtained data caused by jitters will be described.

As shown in FIG. 9(a), output data of the device under test has jitters in a width of a certain range, and a changing point (rising edge or falling edge) of the output data is shifted by an amount equivalent to this range of jitters. Thus, when output data having such jitters is fetched by a fixed strobe, as shown in FIG. 9(b), for example, obtained data becomes "H" in the case of "OUTPUT DATA 1" (FIG. 9(a)), while obtained data becomes "L" in the case of "OUTPUT DATA 2" (FIG. 9(b)).

Thus, in the conventional test apparatus for obtaining the output data by the fixed strobe, a fluctuation occurs in data which must basically be identical because of an influence of the jitters, causing a difficulty of accurate testing and determination.

An influence of such jitters has especially been conspicuous in a high-speed semiconductor device, e.g., a DDR type semiconductor device or the like.

The double data rate (DDR) is a system for transferring data at timing of both rising and falling edges of each clock signal. As compared with a single data rate (SDR) system for transferring data only by a rising edge (or falling edge) of a clock, the DDR system can transfer data twice as much at the same clock cycle, but it is easily affected by the aforementioned jitters. Thus, accurate testing tends to be difficult.

Furthermore, in the conventional test apparatus by the fixed strobe, there has occurred a problem of impossibility of accurately testing the device under test which itself outputs a clock. Recently, a device capable of higher-speed processing has been developed which uses "RapidIO" (registered trademark), "HyperTransport" (registered trademark) or the like noticed as a next-generation I/O interface for achieving a higher speed of data transfer of a semiconductor device (e.g., IBM's CPU for next "PowerPC" (registered trademark) or the like). Such a device employs a configuration in which the device itself outputs a clock signal, and output data from the device must be fetched at edge timing of a clock output from the device itself. In the case of the DDR type device, output data must be fetched at timing of both rising and falling edges of the clock output from the device. In consequence, in the conventional test apparatus that obtains the output data by the fixed strobe, since the output data is fetched at timing unrelated to the clock output from the device, it has been difficult to accurately test the device of this type.

The present invention has been proposed to solve the aforementioned problems inherent in the conventional art, and it is an object of the invention to provide a semiconductor test apparatus which comprises a source synchronous circuit capable of obtaining clocks and output data output from a device under test as time-sequential level data and fetching the output data of the device under test at timing of a rising edge, a falling edge or both rising and falling edges of a clock signal output from the device under test, and which is accordingly capable of fetching the output data at a signal changing point synchronized with jitters of the device, thereby obtaining an accurate testing result irrespective of jitters, and especially suitable for testing a DDR type device from which data is output at both rising and falling edges of a clock as data rates.

DISCLOSURE OF THE INVENTION

A semiconductor test apparatus of the present invention, as described in claim 1, comprises a first time interpolator to which clocks output from a device under test are input and which obtains the clocks by a plurality of strobes having constant timing intervals and which outputs the clocks as time-sequential level data; a second time interpolator to which output data output from the device under test are input and which obtains the output data by a plurality of strobes having constant timing intervals and which outputs the output data as time-sequential level data; and a first selection circuit which receives the time-sequential level data output from the first and second time interpolators, thereby selecting the output data input to the second time interpolator at edge timing of the clocks input to the first time interpolator, and outputting the selected data as measurement data of the device under test, the first and/or second time interpolator being equipped with an edge selector to which the time-sequential level data obtained by the plurality of strobes are input and which selectively outputs level data indicating timing of rising edges and/or falling edges of the level data.

According to the semiconductor test apparatus of the present invention thus configured, there is disposed the source synchronous circuit comprising the time interpolator, the selection circuit and the edge selector, whereby the clock and the output data output from the device under test can be obtained as the time-sequential level data. The time-sequential level data indicates edge timing which is a signal changing point of the clock (or output data) of the device under test. Therefore, the level data indicating the clock edge timing can be obtained, whereby it is possible to use the level data as a timing signal for obtaining the output data of the device under test.

Especially, in the invention, the edge selector is disposed, whereby the time-sequential level data obtained by the plurality of strobes in the time interpolator can be selectively output as level data indicating timing of the rising edge, the falling edge or both rising and falling edges.

Accordingly, even when jitters cause a fluctuation in signal changing point (rising or falling edge) of the clock and the output data of the device under test, it is possible to fetch the output data at timing of the changed clock edge.

Especially, since the output data can be fetched by the timing of the rising edge, the falling edge or both rising and falling edges of the clock, not only the SDR type device but also the DDR type device can be dealt with.

In consequence, the semiconductor test apparatus of the invention can obtain output data at timing changed in accordance with jitters for all types of device under tests, always obtain an accurate testing result without being influenced by jitters, and is particularly suitable for testing a high-speed DDR semiconductor device.

Furthermore, the semiconductor test apparatus of the present invention, as described in claim 2, further comprises a second selection circuit which receives the time-sequential level data output from the first time interpolator, thereby selecting the clocks input to the first time interpolator at edge timing of the clocks input to the first time interpolator, and outputting the selected clocks as clock data of the device under test.

Furthermore, a semiconductor test apparatus of the present invention, as described in claim 3, comprises a first time interpolator to which clocks output from a device under test are input and which obtains the clocks by a plurality of strobes having constant timing intervals and which outputs the clocks as time-sequential level data; and a second selection circuit which receives the time-sequential level data output from the first time interpolator, thereby selecting the clocks input to the first time interpolator at edge timing of the clocks input to the first time interpolator, and outputting the clocks as clock data of the device under test, the first time interpolator being equipped with an edge selector to which the time-sequential level data obtained by the plurality of strobes are input and which selectively outputs level data indicating timing of rising edges and/or falling edges of the level data.

According to the semiconductor test apparatus of the present invention thus configured, the clock of the device under test obtained as the time-sequential level data at the first time interpolator can be fetched based on the level data indicating the edge timing which is a signal changing point of the clock of the device.

In consequence, when jitters cause a fluctuation in the signal changing point of the clock (rising or falling edge), the clock data can be fetched by the changed clock edge timing. For example, if there is an expectation value set in the clock of the device under test, by comparing the clock data with the expectation value, it is possible to determine a pass/failure of the device under test only by the clock data.

As described above, the device under test can be tested only by the clock, whereby a testing process can be simplified and made faster. Therefore, it is possible to realize simple and efficient device testing.

Specifically, in the semiconductor test apparatus of the present invention, as described in claim 4, the first time interpolator comprises a plurality of sequential logic circuits to which the clocks output from the device under test are input; a delay circuit which sequentially inputs strobes delayed at constant timing intervals to the plurality of sequential logic circuits and which outputs the time-sequential level data from the sequential logic circuits; an edge selector to which the time-sequential level data output from the plurality of sequential logic circuits are input and which outputs level data indicating a rising edge, level data indicating a falling edge, or level data indicating rising and falling edges of the time-sequential level data obtained by inputting the clocks of the device under test; and an encoder to which the level data output from the edge selector is input and which encodes the level data as timing data indicating edge timing of the clocks of the device under test and which outputs the timing data.

Furthermore, as described in claim 5, the second time interpolator comprises a plurality of sequential logic circuits to which the output data output from the device under test are input; and a delay circuit which sequentially inputs strobes delayed at constant timing intervals to the plurality of sequential logic circuits and which outputs the time-sequential level data from the sequential logic circuits.

The second time interpolator, as described in claim 6, comprises an edge selector to which the time-sequential level data output from the plurality of sequential logic circuits are input and which outputs level data indicating a rising edge, level data indicating a falling edge, or level data indicating rising and falling edges of the time-sequential level data obtained by inputting the output data of the device under test; and an encoder to which the level data output from the edge selector is input and which encodes the level data as timing data indicating edge timing of the output data of the device under test and which outputs the timing data.

The edge selector, as described in claim 7, comprises one or more selector circuits comprising a first AND circuit to which an inverted output of one sequential logic circuit and a non-inverted output of a next-stage sequential logic circuit are input, a second AND circuit to which a non-inverted output of one sequential logic circuit and an inverted output of a next-stage sequential logic circuit are input, an OR circuit to which outputs of the first and second AND circuits are input, and a selector which selects one of outputs of the first and second AND circuits and the OR circuits.

The first selection circuit, as described in claim 8, comprises a selector which selects one data among the time-sequential level data input from the second time interpolator by using the time-sequential level data encoded by the first time interpolator as selection signals and which outputs the selected data as measurement data of the device under test.

The second selection circuit, as described in claim 9, comprises a selector which selects one data among the time-sequential level data input from the first time interpolator by using the time-sequential level data encoded by the first time interpolator as selection signals and which outputs the selected data as clock data of the device under test.

As understood from the above, according to the semiconductor test apparatus of the invention, the first and second time interpolators including the edge selector, and the first and second selection circuits that constitute the source synchronous circuit can be simply configured by using existing parts such as the sequential logic circuit, the delay circuit, the encoder, the selector, the AND circuit, and the OR circuit.

In consequence, without complicating or enlarging the semiconductor test apparatus of the invention and without increasing costs or the like, it is possible to realize an LSI tester comprising the source synchronous circuit of the invention with a simple configuration.

Furthermore, according to the source synchronous circuit of the aforementioned configuration, the number of sequential logic circuits, the delay amount of the delay circuit, the number of edge selectors, and the like can be changed, therefore a bit width (number of sequential logic circuits) and resolution (delay amount of the delay circuit) of the time-sequential level data at each of the first and second time interpolators can set to arbitrary values.

In consequence, various settings are enabled in accordance with a data rate, a jitter width, or the like, and it is possible to realize a highly versatile and convenient LSI capable of dealing with all types of LSI's.

According to the semiconductor test apparatus of the invention, the sequential logic circuits disposed in the first and second time interpolators can be simply configured by using existing circuits such as flip-flops or latches. Thus, without complicating or enlarging the time interpolator and without increasing costs or the like, it is possible to realize an LSI tester comprising the source synchronous circuit of the invention by a simple configuration.

Furthermore, the semiconductor test apparatus of the present invention, as described in claim 10, further comprises a bus which interconnects the first and second time interpolators and which distributes data output from the first and second time interpolators to predetermined selection circuits.

According to such a configuration, in the semiconductor test apparatus of the present invention, the time-sequential level data output from the first and second time interpolators can be input by being distributed to the first and second selection circuits through the bus, and a desired clock is allocated to desired output data, and input to the selection circuit, whereby measurement data can be obtained. Thus, even when pluralities of first and second time interpolators and first and second selection circuits are disposed, measurement data can be fetched by arbitrarily combining each clock and output data. It is accordingly possible to realize a high versatile and convenient LSI tester.

Additionally, according to the semiconductor test apparatus of the invention, as described in claim 6, an edge selector and an encoder can be disposed on the second time interpolator side, therefore the first and second time interpolator can be configured to be exactly identical. Thus, for example, when a plurality of per-pin corresponding source synchronous circuits are disposed in the LSI tester, all the synchronous circuits can be made identical in configuration. A clock and output data of the device under test can be allocated to an arbitrary channel of each source synchronous circuit, and channel allocation work can be easily and efficiently carried out.

Furthermore, by disposing the source synchronous circuits identical in configuration, the clock and the output data of the device under test can be allocated to all of the plurality of source synchronous circuits. When pluralities of clocks or output data are output from the device under test, desired output data can be obtained by desired timing. Thus, it is possible to realize a highly versatile and convenient test apparatus capable of dealing with all types of devices.

BRIEF DESCRIPTION OF THE DRAWINGS

FIG. 3(a) showing a case of obtaining the output data at timing of a rising edge, FIG. 3(b) showing a case of obtaining the output data by a falling edge, and FIG. 3(c) showing a case of obtaining the output data at timing of both rising and falling edges;

FIG. 9(a) showing jitters of the output data, and FIG. 9(b) showing a state in which an error occurs in obtained data because of the jitters.

BEST MODE FOR CARRYING OUT THE INVENTION

A preferred embodiment of a semiconductor test apparatus of the present invention will be described with reference to the accompanying drawings.

Figure 1:
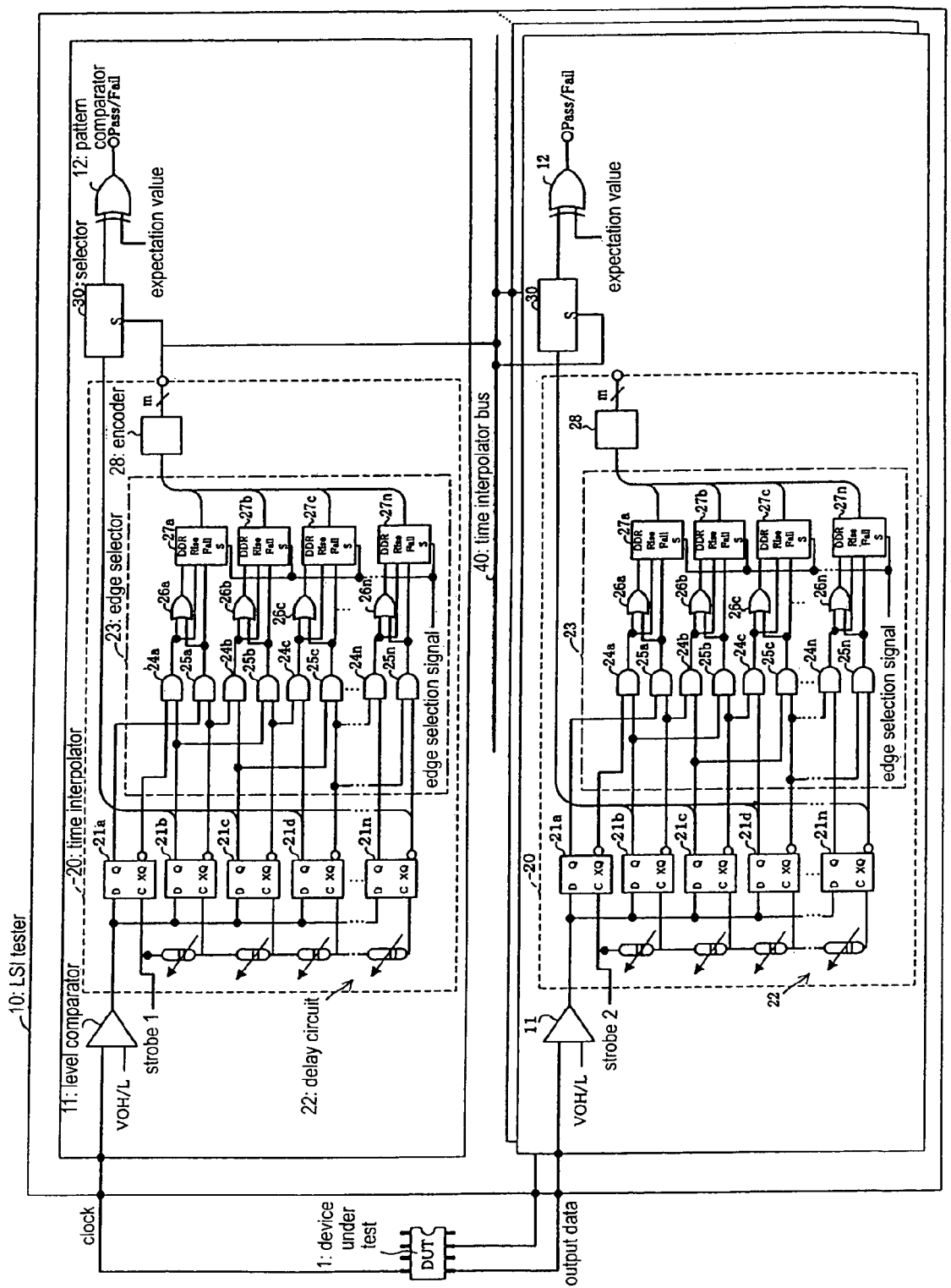
FIG. 1 is a block diagram showing a configuration of a semiconductor test apparatus according to an embodiment of the present invention.

FIG. 1 is a block diagram showing a configuration of a semiconductor test apparatus according to an embodiment of the present invention. As shown, the semiconductor test apparatus of the embodiment comprises an LSI tester 10 for testing functions of a DUT 1. The LSI tester 10 determines a pass/failure of the DUT 1 by obtaining output data output from the DUT 1 as measurement data and comparing this data with predetermined expectation value data.

The DUT 1 receives a signal input from a pattern generator or the like (not shown), and accordingly outputs predetermined output data and a clock signal. As such an LSI that outputs a clock itself, for example, there is an LSI which uses the aforementioned "RapidIO" (registered trademark) or "HyperTransport" (registered trademark), an LSI which converts a bus system from a PCI bus into "RapidIO", or the like. In the test apparatus of the embodiment, such a device can be tested.

The DUT 1 may comprise not only an SDR type device but also a DDR type device such as a DDR-SDRAM. The double data rate (DDR) is a system for transferring data at timing of both rising and falling edges of each clock signal. As compared with a single data rate (SDR) system for transferring data only by a rising edge (or falling edge) of a clock, the DDR type device is a high-speed device capable of transferring data twice as much at the same clock cycle. In the semiconductor test apparatus of the embodiment, such a DDR type device can also be tested accurately.

According to the embodiment, by inputting the clock output from the DUT 1 to a plurality of LSI testers 10, the output data of the DUT 1 is obtained by clock timing of the DUT 1, and output as measurement data.

Specifically, the LSI tester 10 comprises a source synchronous circuit for obtaining clocks and output data output from the DUT 1 by a plurality of strobes having constant timing intervals, outputting the data as time-sequential level data, and selecting and obtaining output data (or clock data) at edge timing of the clock of the DUT 1 using the time-sequential level data.

The source synchronous circuit corresponds per pin to each clock or output data output from the DUT 1, and circuits of similar configurations are allocated to pins one each.

According to the embodiment, as shown in FIG. 1, one source synchronous circuit is disposed on a clock side of the DUT 1, and 1 to n (1 to n channels) source synchronous circuits are disposed on an output data side of the DUT 1.

The source synchronous circuits are interconnected through a time interpolator bus 40. Under control of the time interpolator bus 40 as described later, a signal is input/output between predetermined channels (source synchronous circuits).

As shown in FIG. 1, the source synchronous circuits are configured to be identical on both of a clock and output data sides. Specifically, each source synchronous circuit comprises a level comparator 11, a pattern comparator 12, a time interpolator 20, and a selector 30.

The level comparator 11 receives an output signal (clock or output data) from the DUT 1, compares the signal with a predetermined comparison voltage in level, and outputs the signal to the time interpolator 20.

The pattern comparator 12 compares output data of the DUT 1 selected by the selector 30 through the time interpolator 20 (described below) with a predetermined expectation value, and outputs a result of testing.

The time interpolator 20 obtains the clocks or the output data output from the DUT 1 by a plurality of strobes having constant timing intervals, and outputs the data as time-sequential level data.

Specifically, the time interpolator 20 comprises flip-flops 21a to 21n which are a plurality of sequential logic circuits, a delay circuit 22, an edge selector 23, and an encoder 28.

According to the embodiment, the plurality of flip-flops 21a to 21n comprise D type flip-flop groups connected in parallel, each of which receives the output signal (clock or output data) output from the device under test through the level comparator 11 as input data. Then, using a strobe input through the delay circuit 22 as a clock signal, the input data is output by predetermined timing.

It is to be noted that a first flip-flop 21a of the plurality of flip-flops 21a to 21n is for an initial value, and output data of the flip-flops 21b to 21n of the second and after are input to the selector 30 (described below).

Here, the plurality of sequential logic circuits disposed in the time interpolator 20 can comprise sequential logic circuits other than the flip-flops 21a to 21n of the embodiment, e.g., latches. By disposing the latches as the sequential logic circuits in the time interpolator 20, effects similar to those of the embodiment can be provided. Moreover, the sequential logic circuits disposed in the time interpolator 20 may employ any circuitry other than the flip-flops 21a to 21n of the embodiment and the latches as long as the clock and the output data output from the DUT 1 can be obtained at a fixed timing interval and output as time-sequential level data.

The delay circuit 22 sequentially inputs strobes delayed at constant timing intervals to clock terminals of the plurality of flip-flops 21a to 21n, and time-sequential level data are output from the flip-flops 21a to 21n.

Here, the number of flip-flops 21a to 22n, and a delay amount of the delay circuit 22 can be arbitrarily set and changed, and a bit width (number of sequential logic circuits) and resolution (delay amount of the delay circuit) of the time-sequential level data obtained in the time interpolator 20 can be set to desired values. Accordingly, time-sequential level data that are obtained can be variously set in accordance with a data rate, a jitter width or the like of the DUT 1 which becomes a testing target, whereby all types of LSI's can be dealt with.

The strobes input to the flip-flops 21a to 21n can be set to arbitrary timing and frequencies, and input timing and delay amounts can be varied between the clock side and the output data side. According to the embodiment, by disposing a timing generator or the like different from channel to channel of each source synchronous circuit, strobes are independently input on the clock and output data sides (see "STROBE 1" of the clock side and "STROBE 2" of the output data side shown in FIG. 1). Thus, it is possible to make an adjustment to proper timing in accordance with a phase difference between the clock and the output data output from the DUT 1.

The clock and the output data output from the DUT 1 are not always coincident with each other in phase. For example, a setup time may become minus or plus. Accordingly, in such a case, by varying timing of strobes between the clock and output data sides, an adjustment can be made so as to output strobes at timing proper for the clock and the output data which have a phase difference therebetween.

The edge selector 23 receives the time-sequential level data output from the flip-flops 21a to 21n, and selectively outputs level data indicating a rising edge, level data indicating a falling edge, or level data indicating rising and falling edges of the level data.

Specifically, the edge selector 23 of the embodiment comprises a plurality of selector circuit groups constituted of two AND circuits 24, 25, one OR circuit 26, and one selector 27 corresponding to outputs of the flip-flops 21a to 21n.

As shown in FIG. 1, the first AND circuit 24 (24a to 24n) is an AND circuit which receives an inverted output of one flip-flop (e.g., 21a) of the plurality of flip-flops 21a to 21n and a non-inverted output of a next-stage flip-flop (e.g., 21b). An output of this first AND circuit 24 is selected as SDR level data indicating a rising edge (Rise Edge) of a clock.

As shown in FIG. 1, the second AND circuit 25 (25a to 25n) is an AND circuit which receives a non-inverted output of one flip-flop (e.g., 21a) of the plurality of flip-flops 21a to 21n and an inverted output of a next-stage flip-flop (e.g., 21b). An output of this second AND circuit 25 is selected as SDR level data indicating a falling edge (Fall Edge) of a clock.

As shown in FIG. 1, the OR circuit 26 (26a to 26n) is an OR circuit to which outputs of the first and second AND circuits 24 and 25 are input. An output of this OR circuit 26 is selected as DDR level data indicating both rising and falling edges (Both Edge) of a clock.

As shown in FIG. 1, the selector 27 (27a to 27n) is a selection circuit which comprises a multiplexer or the like for receiving the outputs of the first and second AND circuits 24 and 25 and the OR circuit 26, and selecting and outputting one thereof by switching an edge selection signal.

By disposing the edge selector 23, when the time-sequential level data obtained by the plurality of strobes through the flip-flops 21a to 21n are input, by selection of the selectors 27a to 27n, one of the followings is selected and output: (1) the output of the first AND circuit 24 (rising edge only: Rise Edge), (2) the output of the second AND circuit 25 (falling edge only: Fall Edge), and (3) the output of the OR circuit 26 (both rising and falling edges: Both Edge), and edge timing indicated by the selected level data is encoded by an encoder 28 of a next stage.

Among the outputs of the plurality of flip-flops 21a to 21n, the outputs of one flip-flop and the next-stage flip-flop are input to the plurality of selector circuit groups constituting the edge selector 23. Accordingly, the level data selected and output by the selectors 27a to 27n become data 1-bit smaller than the level data output from the flip-flops 21a to 21n. For example, if 5-bit level data are output from five flip-flops 21a to 21e, level data selected and output by the edge selector 23 become 4-bit data output through four selectors 27a to 27d.

Thus, the number of circuits disposed in the edge selector 23, i.e., each of the first AND circuits 24a to 24b, the second AND circuits 25a to 25n, the OR circuits 26a to 26n, and the selectors 27a to 27b, is smaller by 1 (1 to n−1) than that of the flip-flops 21a to 21n.

The encoder 28 receives the time-sequential level data output from the plurality of selectors 27a to 27n of the edge selector 23, and encodes and outputs the level data.

Specifically, data sequentially output from the flip-flops 21a to 21n at fixed intervals are input through the selectors 27a to 27n of the edge selector 23 to the encoder 28, encoding is executed at timing when all data are prepared, and a result thereof is output. Accordingly, the time-sequential level data output from the flip-flops 21a to 21n are selected through the edge selector 23, and the selected level data are encoded and output.

Then, according to the embodiment, the encoder 28 of the source synchronous circuit of the clock side receives the time-sequential level data output from the plurality of flip-flops 21a to 21n, thereby encoding and outputting timing data indicating edge timing of the clock of the DUT 1.

In the source synchronous circuit of the output data side, as described later, the time-sequential level data output from the flip-flops 21a to 21n are directly input to the selector 30. In other words, according to the embodiment, the edge selector 23 and the encoder 28 are not used on the output data side.

Thus, for the time interpolator 20 of the output data side, according to the embodiment, the edge selector 23 and the encoder 28 can be omitted.

The selector 30 is a selection circuit which comprises a multiplexer or the like for receiving the time-sequential level data output from the plurality of flip-flops 21a to 21n, thereby selecting output data of the DUT 1 at edge timing of the clock of the DUT 1, and outputting the selected data as measurement data of the DUT 1.

Specifically, in the selector 30 of the embodiment, the outputs of the flip-flops 21b to 21n excluding the initial value flip-flop 21a among the plurality of flip-flops are directly connected to a data input side, and the time interpolator bus 40 is connected to a select signal terminal.

The time-sequential level data output from the flip-flops 21a to 21n of the output data side are directly input to the selector 30 of the output data side not through the edge selector 23 or the encoder 28 and, under control of the time interpolator bus 40, the time-sequential level data encoded by the encoder 28 of the clock side are input as selection signals of the selector 30 of the output data side.

Accordingly, first, the time-sequential level data output from the flip-flops 21a to 21n of the time interpolator 20 of the output data side are input as input data to the selector 30 of the output data side. Thus, using a signal from the encoder 28 of the clock side as a selection signal, one data is selected among the level data of the output data side.

Then, the output data of the DUT 1 selected by this selector 30 is output to the pattern comparator 12, and compared with a predetermined expectation value by the pattern comparator 12, and a testing result is output.

On the other hand, the time-sequential level data output from the flip-flops 21a to 21n of the clock side are directly input as input data to the selector 30 of the clock side not through the edge selector 23 or the encoder 28, and a signal from the encoder 28 of the clock side is directly input as a selection signal.

Accordingly, in the selector 30 of the clock side, the clock signal of the DUT 1 is selected and output as data, and the clock of the DUT 1 obtained as the time-sequential level data at the clock side time interpolator 20 can be fetched by level data indicating edge timing which is a signal changing point of the clock of the device.

Thus, if there is an expectation value set in the clock of the DUT 1, the clock data output through the selector 30 can be compared with a predetermined expectation value by the pattern comparator 12.

Here, in each of the selectors 30 of the clock and output data sides, input selection signals are switched under control of the time interpolator bus 40, and a desired selector 30 can be used.

Specifically, in the case of comparing the output data of the DUT 1 with the expectation value by using the selector 30 of the output data side, a signal from the encoder 28 of the clock side is input as a selection signal to the selector 30 of the output side through the time interpolator bus 40. In this case, the selector 30 (and pattern comparator 12) of the clock side is not used.

On the other hand, according to the embodiment, in the case of comparing the clock of the DUT 1 with the expectation value by using the selector 30 of the clock side, a signal from the encoder 28 of the clock side is not input to the selector 30 of the output side under control of the time interpolator bus 40. In this case, the selector 30 (and pattern comparator 12) of the output data side is not used.

As described above, according to the embodiment, the output signal from the time interpolator 20 is selectively input to each of the selectors 30 of the clock and output data sides in accordance with testing contents or the like. As a result, depending on testing contents, the selector 30 only needs to be disposed in at least one of the source synchronous circuits of the clock and output data sides, and the selector 30 of either the clock side or the output data side can be omitted.

However, by disposing the selectors 30 on both of the clock and output data sides, versatility and expandability of the test apparatus can be improved: e.g., a clock and data can be simultaneously tested by inputting signals from the encoder 28 of the clock side to the selectors 30 of the clock and output data sides, a clock or output data can be freely allocated to an arbitrary pin of each of the selectors 30 of the clock and output data sides, and the like. Thus, according to the embodiment, the selectors 30 are disposed on both of the clock and output data sides as shown in FIG. 1.

The time interpolator bus 40 is a transmission line for interconnecting the source synchronous circuits of the clock and output data sides. As shown in FIG. 1, the time interpolator bus 40 of the embodiment connects a select terminal of the selector 30 of each channel (source synchronous circuit) of the output data side with an output terminal of the encoder 28 of the clock side through a switch or the like, and controls a switch so that the signal from the encoder 28 of the clock side can be input as a selection signal to the selector 30 of any one of the channels of the output data side.

Though not shown in FIG. 1, a plurality of time interpolator buses 40 for distributing data to the plurality of source synchronous circuits are disposed corresponding to the channels of the source synchronous circuits.

Information on which of the selectors 30 of the channels the signal from the encoder 28 of the clock side is input to as a selection signal is usually preset. Accordingly, in accordance with this information, the switch can be set to ON/OFF before the test apparatus is used. Control information of the ON/OFF can be written in a control register or the like (not shown) beforehand.

By disposing such a time interpolator bus 40, the time-sequential level data obtained by the clock side source synchronous circuit can be input as selection signals to a desired selector 30 of the output data side.

Thus, output data obtained through a desired channel can be obtained as measurement data. Accordingly, even if a plurality of source synchronous circuits including selectors 30 are disposed in accordance with a configuration, a data rate, a jitter width or the like of the DUT 1, it is possible to fetch measurement data by arbitrarily combining clock data and output data.

For example, when pluralities of clocks and output data are sent from the DUT 1, data can be allocated to channels of arbitrary source synchronous circuits: e.g., "CLOCK 1 AND OUTPUT DATA 1", "CLOCK 2 AND OUTPUT DATA 2", and the like.

In this case, measurement data can be independently obtained at timing of "CLOCK 1" for the "OUTPUT DATA 1" and timing of "CLOCK 2" for the "OUTPUT DATA 2".

The selection signal is directly input from the encoder 28 of the clock side to the selector 30 of the clock side. Thus, a signal of the "CLOCK 1" can be obtained as measurement data at timing of the "CLOCK 1" not through the time interpolator bus 40.

Next, an operation of the semiconductor test apparatus of the embodiment thus configured will be described.

First, when a predetermined test pattern signal is input to the DUT 1 from the pattern generator (not shown) disposed in the test apparatus, predetermined output data and a predetermined clock corresponding to the pattern signal are output from the DUT 1.

The clock and the output data output from the DUT 1 are input to different channels of the source synchronous circuit.

The clock and the output data input to each source synchronous circuit are input to the level comparator 11, compared with a comparison voltage in level, and then input to each time interpolator 20.

A signal (clock or output data) input to each time interpolator 20 is first input to the plurality of flip-flops 21a to 21n connected in parallel. Then, strobes are input at constant timing intervals by the delay circuit 22 to the clock terminals of the flip-flops 21a to 21n to which the clock or the output data is input.

Accordingly, the input clock or output data is obtained as time-sequential level data from the flip-flops 21a to 21n, and output.

Then, in the LSI tester 10 of the clock side, the time-sequential level data output from the flip-flops 21a to 21n is input to the edge selector 23 and the selector 30 of the clock side.

The level data input to the edge selector 23 is input through the first and second AND circuits 24, 25 and the OR circuit 26 to the plurality of selectors 27a to 27n, and edge select signals are switched to select and output one signal.

Level data output from each of the selectors 27a to 27n is output as level data indicating timing of (1) a rising edge only (output of first AND circuit 24), (2) a falling edge only (output of second AND circuit 25), or (3) both rising and falling edges (output of OR circuit 26) indicated by the level data.

The level data obtained by the edge selector 23 is input to the encoder 28 and encoded.

The level data encoded by the encoder 28 becomes timing data indicating edge timing (rising edge, falling edge, or both rising and falling edges) of the clock.

This timing data is input to the time interpolator bus 40, distributed through the time interpolator bus 40 to predetermined source synchronous circuits of the output data side, and input as a selection signal to the selector 30 of the output data side.

Additionally, the timing data is input as a selection signal to the selector 30 of the clock side directly, i.e., not through the time interpolator bus 40.

On the other hand, in the source synchronous circuit of the output data side, the time-sequential level data obtained by the flip-flops 21a to 21n, excluding the data of the initial value flip-flop 21a, are directly input as input data to the selector 30. Accordingly, in the selector 30 of the output data side, one data is selected among the time-sequential level data indicating output data by using the timing data input from the clock side encoder 28 as a selection signal, and this data is output as measurement data.

Then, the output data output from the selector 30 of the output data side is input to the pattern comparator 12, and compared with predetermined expectation value data output from the pattern generator in the tester, and a result of the comparison is output.

Based on the result of the comparison, coincidence/non-coincidence between the output data and the expectation value is detected, and determination is made as to a pass/failure (Pass/Fail) of the DUT 1.

That is, Pass determination is made when the output of the selector 30 coincides with the expectation value. Fail determination is made in the case of non-coincidence.

Further, in the source synchronous circuit of the clock side, the time-sequential level data of the clock obtained by the flip-flops 21a to 21n, excluding the data of the initial value flip-flop 21a, are directly input as input data to the selector 30 of the clock side.

Then, in the selector 30 of the clock side, one data is selected among the time-sequential level data indicating clocks by using the timing data input from the clock side encoder 28 as a selection signal, and this data is output as measurement data.

Accordingly, the output data output from the selector 30 of the clock side is input to the pattern comparator 12, whereby it can be compared with predetermined expectation value data of the clock. Thus, based on a result of the comparison with the expectation value, coincidence/non-coincidence between the clock data and the expectation value can be detected, and determination can be made as to a pass/failure (Pass/Fail) of the DUT 1 only by a clock signal.

Hereinafter, referring to FIGS. 2(a) to 8, a specific embodiment will be described.

[Basic Operation]

First, referring to FIGS. 2(a) and 2(b), description will be made of a basic operation when output data is obtained at timing of a rising edge of a clock of a DUT 1 in a test apparatus of an embodiment. FIGS. 2(a) and 2(b) are signal views showing operations of obtaining output data at edge timing of the clock of the DUT 1, showing a case of obtaining output data at timing of a rising edge of the clock in an SDR type device.

Figure 2:
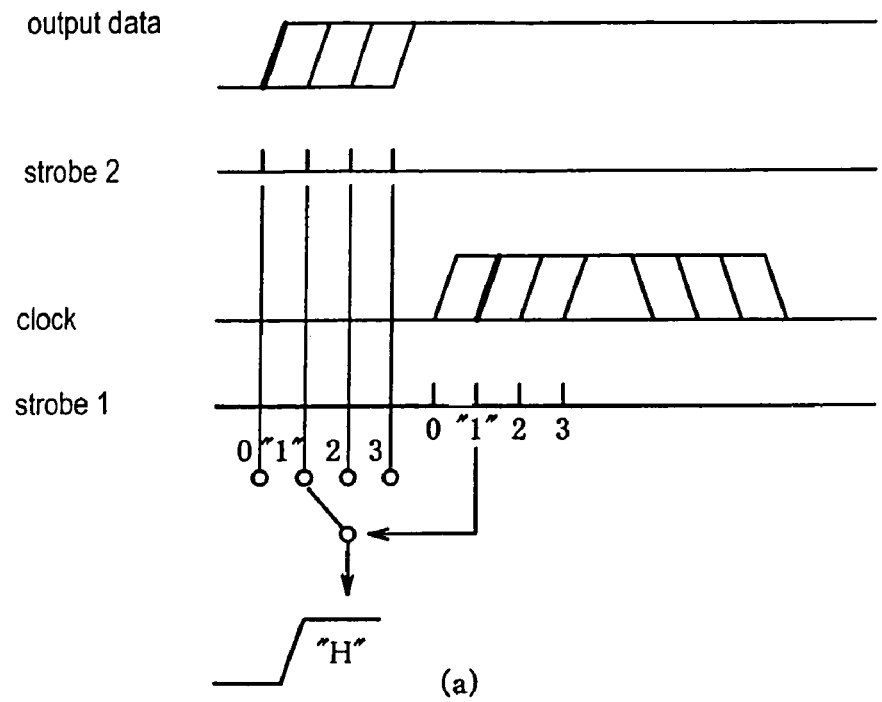
FIGS. 2(a) and 2(b) are signal views showing operations of obtaining output data at timing of a rising edge of a clock for an SDR type device under test in the semiconductor test apparatus of the embodiment of the invention.
Figure 2:
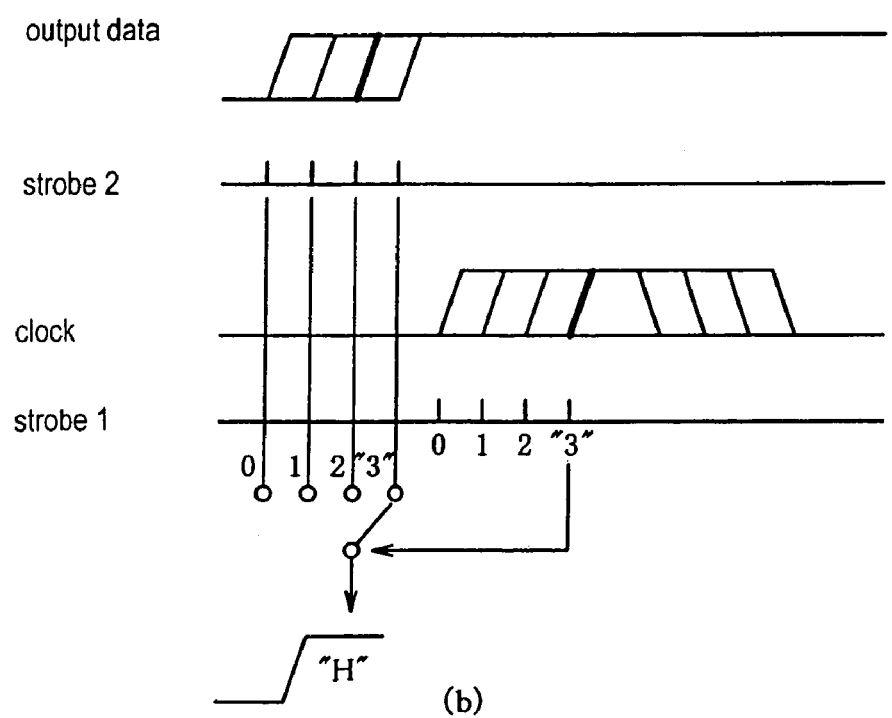
Figure 3:
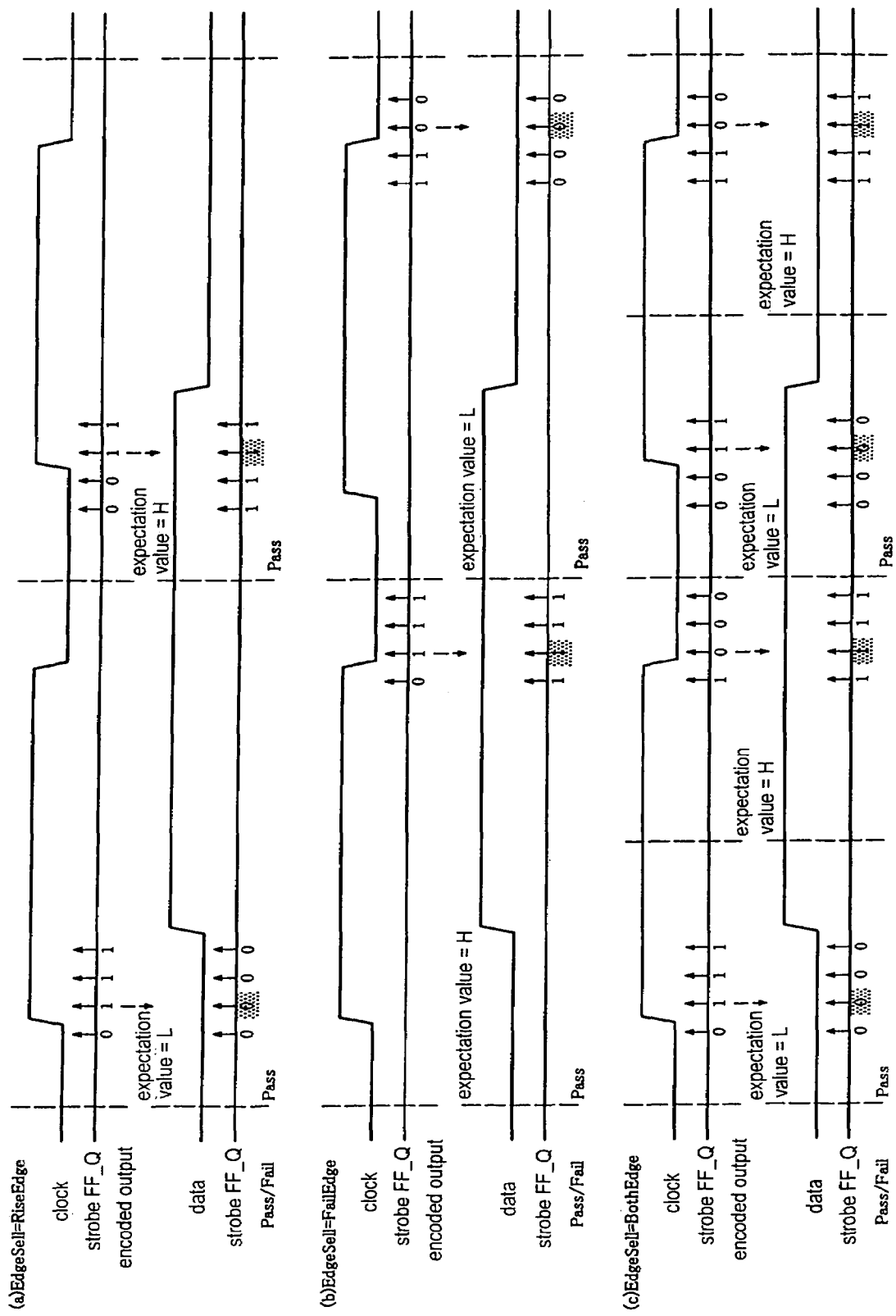
FIGS. 3(a) to 3(c) are signal views showing operations of obtaining output data at edge timing of a clock of the device under test in the semiconductor test apparatus of the embodiment of the invention.
Figure 4:
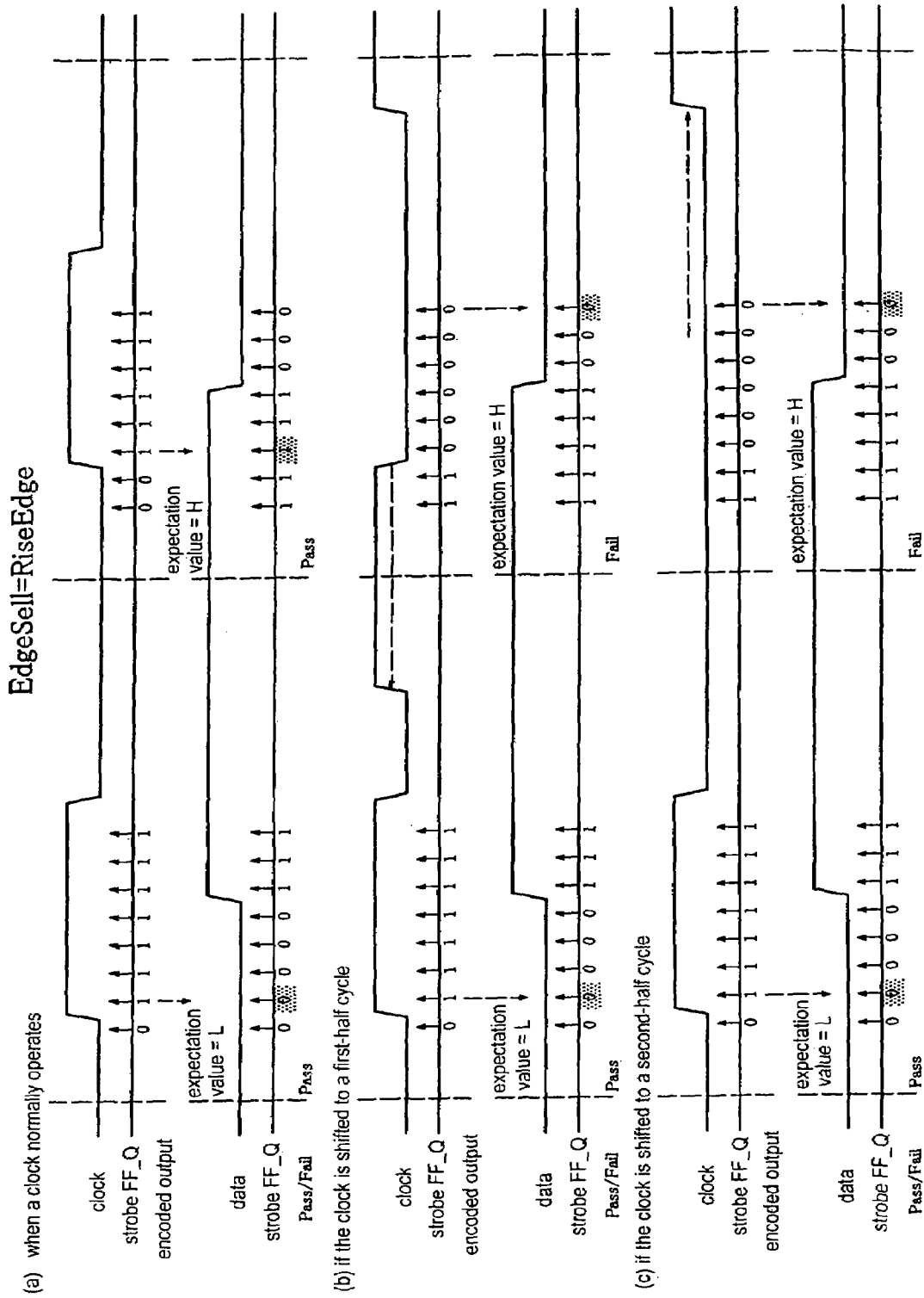
FIGS. 4(a) to 4(c) are signal views when output data is obtained at timing of a rising edge of a clock of an SDR type DUT 1 in the semiconductor test apparatus of the embodiment of the invention.
Figure 5:
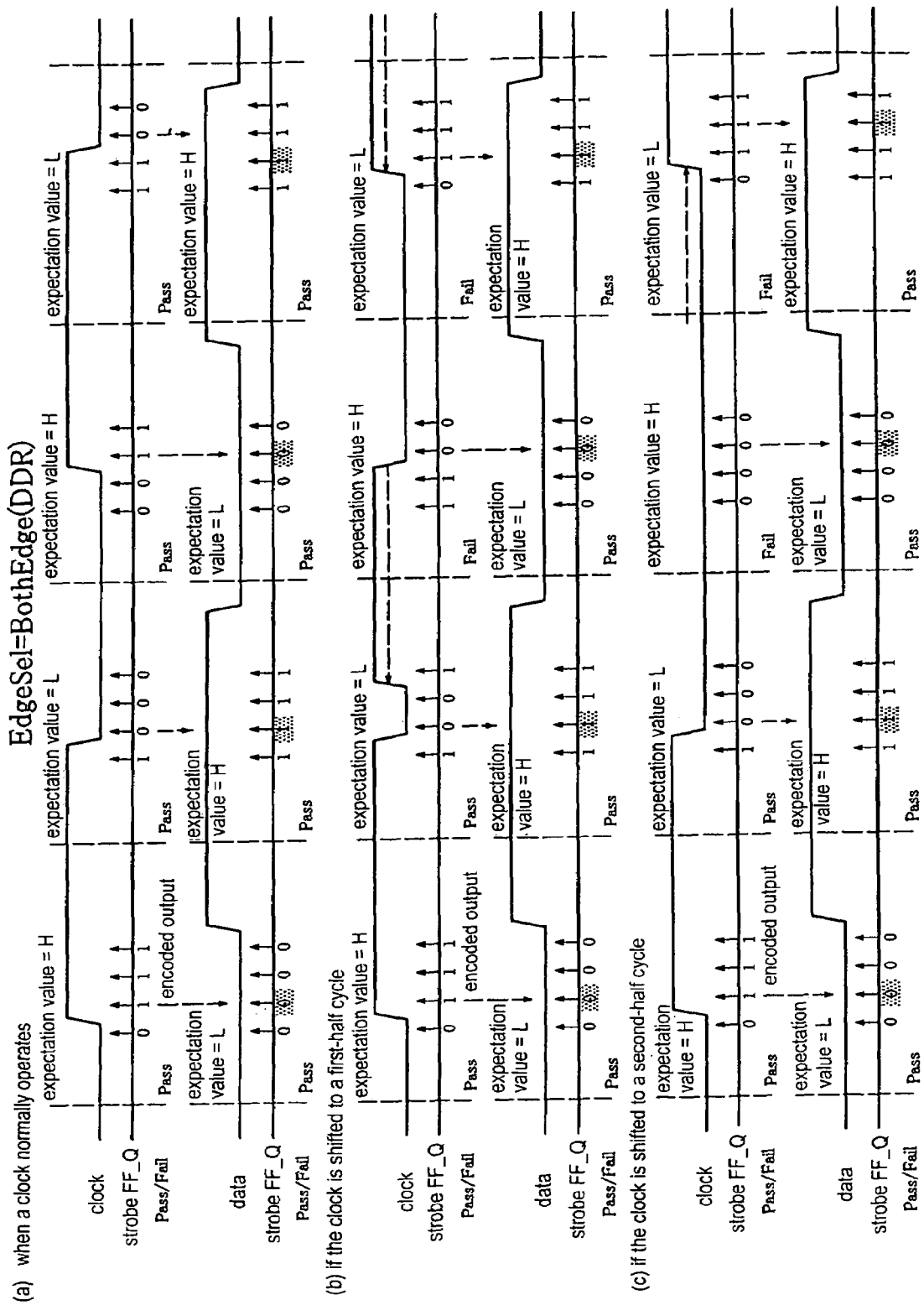
FIGS. 5(a) to 5(c) are signal views when output data is obtained at timing of both rising and falling edges of a clock of a DDR type DUT 1 in the semiconductor test apparatus of the embodiment of the invention, showing a case in which there is an expectation value in the clock.
Figure 6:
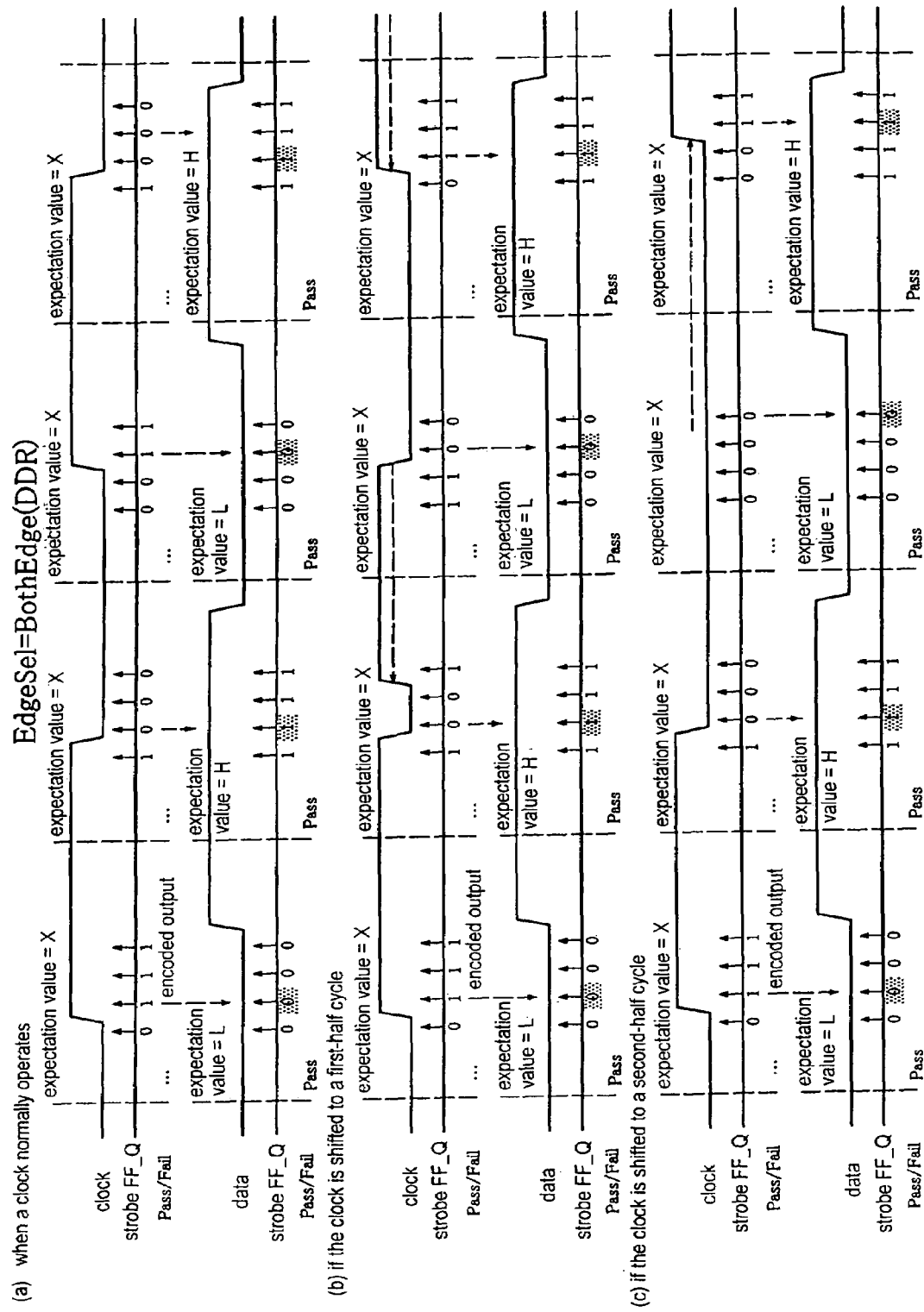
FIGS. 6(a) to 6(c) are signal views when output data is obtained at timing of both rising and falling edges of the clock of the DDR type DUT 1 in the semiconductor test apparatus of the embodiment of the invention, showing a case in which there is no expectation value in the clock.
Figure 7:
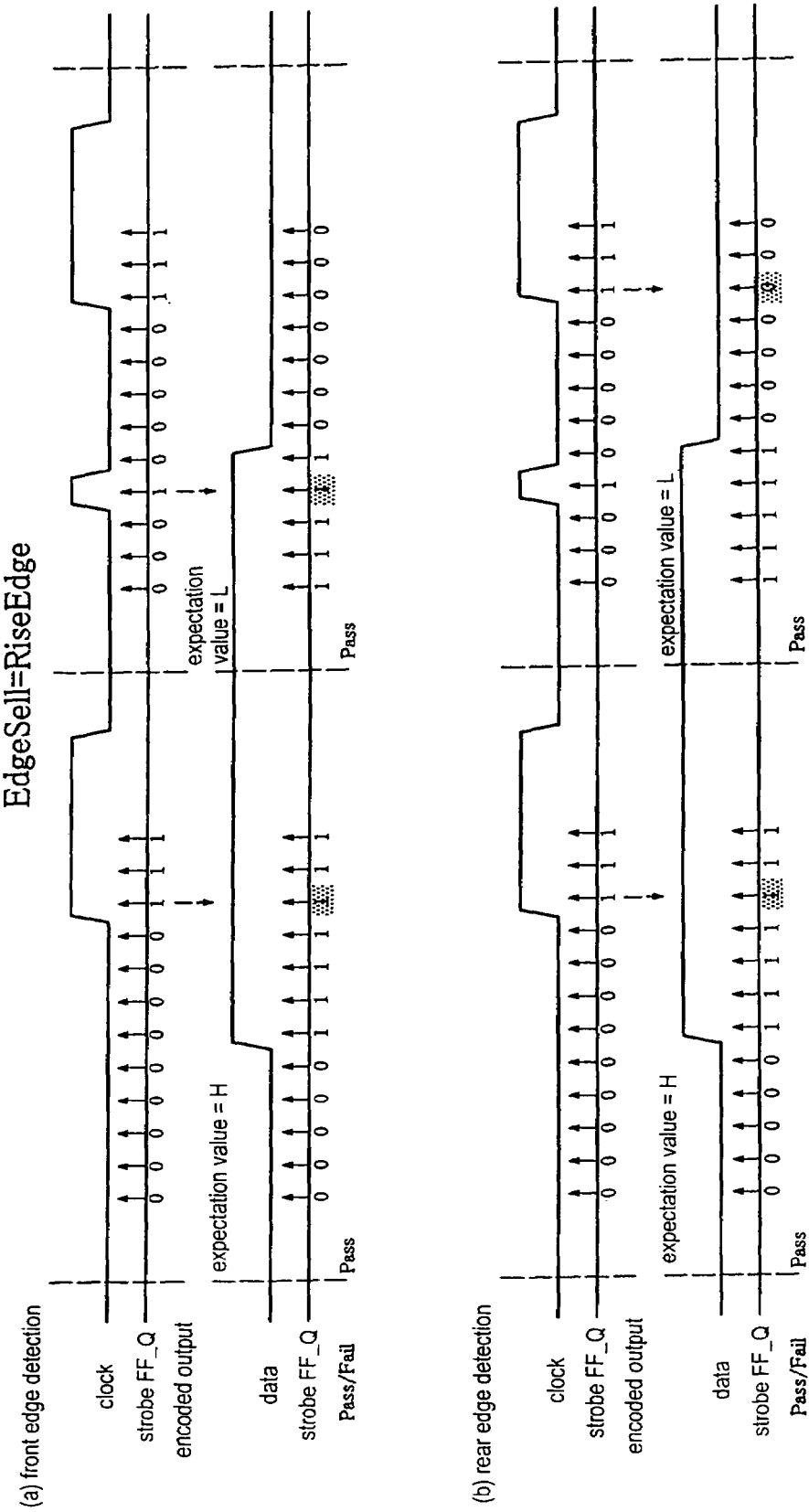
FIGS. 7(a) and 7(b) are signal views showing a difference between cases of executing front and rear clock edge detections.
FIG. 7(s) showing the case of the front edge detection, and FIG. 7(b) showing the case of the rear edge detection.
Figure 8:
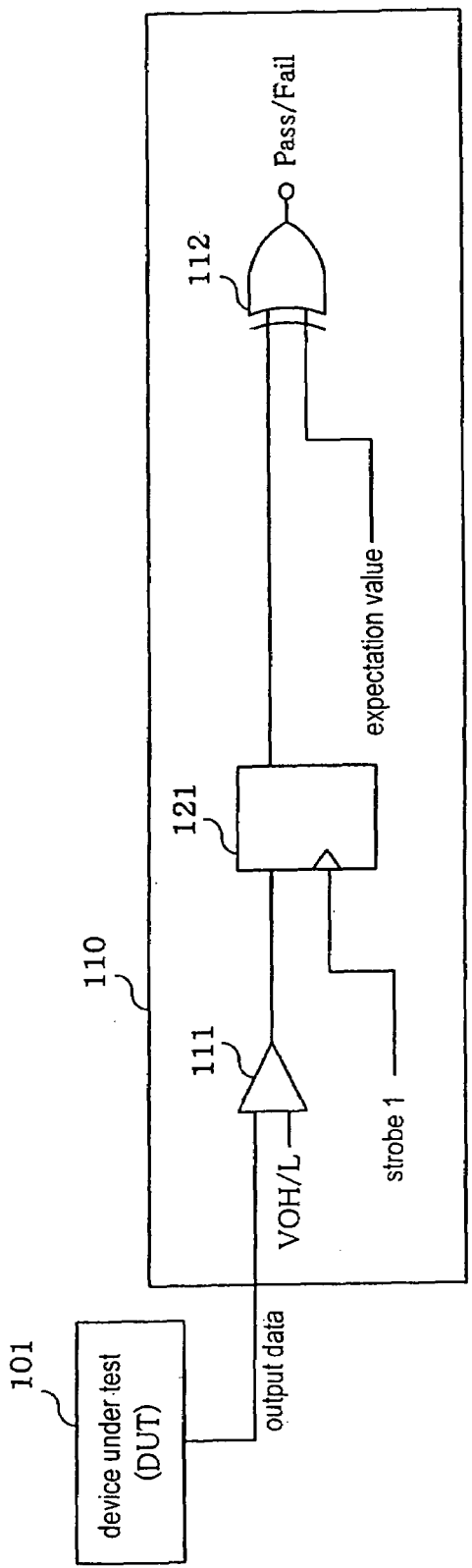
FIG. 8 is a block diagram showing a configuration of a conventional semiconductor test apparatus.

According to the embodiment shown in FIG. 2, each time interpolator 20 constituting a source synchronous circuit comprises five flip-flops 21a to 21e which include an initial value flip-flop 21a, and an edge selector 23 comprises four selector circuit groups (first AND circuits 24a to 24d, second AND circuits 25a to 25d, OR circuits 26a to 26d, and selectors 27a to 27d). A clock and output data output from the DUT 1 are obtained as level data of a bit number "4" at the four flip-flops 21b to 21e excluding the initial value flip-flop 21a.

Then, output data side level data of a bit number "4" are obtained by clock level data of a bit number "4" output through the first AND circuits 24a to 24d and the selectors 27a to 2d of the edge selector 23 of the clock side.

First, in the case of a signal shown in FIG. 2(a), rising edge timing by which a clock output from the DUT 1 becomes "H" from "L" is in a position of "1" of a bit number "0 to 3", while timing of a signal changing point by which output data becomes "H" from "L" is in a position of a bit number "0" (see thicker line portion in the drawing).

In this case, first, for the clock, for example, level data of "0111" ("H" from position of bit number "1") is obtained by the flip-flops 21b to 21e excluding that for the initial value of the clock side time interpolator 20, and this data is input to the edge selector 23.

In the edge selector 23 of the embodiment, when timing of a rising edge (Rise Edge) is selected by an edge select signal and level data is input through the first AND circuit 24 to the four selectors 27a to 27d, level data indicating "1000" ("H" from position of bit number "1") is output from each of the selectors 27a to 27d.

Then, the level data "1000" is encoded as timing data (e.g., "001") indicating a bit number "1" by the encoder 28.

It is to be noted that when there is no rising edge in a clock, for example, in the case of "High from initial value" or in the case of "Low from initial value to last bit", an output of the edge selector 23 becomes "ALL 0", and the encoder 28 outputs, e.g., "100" indicating a full-scale (overflow) as a selection signal of the selector 30.

Table 1 shows a relation between the clock rising edge position and the outputs of the flip-flops 21a to 21d including that for the initial value, the edge selector 23, and the encoder 28 of the embodiment.

TABLE 1

| Position of clock edge | Output of FF (including initial value) | Output of edge selector | Output of encoder |
|---|---|---|---|
| "No edge" | 11111 | 0000 | 100 |
| "0" | 01111 | 1000 | 000 |
| "1" | 00111 | 0100 | 001 |
| "2" | 00011 | 0010 | 010 |
| "3" | 00001 | 0001 | 011 |
| "No edge" | 00000 | 0000 | 100 |

The output data of the DUT 1 is obtained as level data of, e.g., "1111" ("H" from position of bit number "0") by the flip-flops 21b to 21e, excluding that for the initial value, of the source synchronous circuit of the output data side, and this data is input to each input terminal of the selector 30. Then, in the selector 30 of the output data side, data of an input terminal corresponding to a bit number "1" is selected based on a selection signal ("001") from the clock side. As a result, data output from the selector 30 becomes "H".

Table 2 shows a relation between the output data input to the input terminal of the selector 30 of the output data side and the selection signal.

TABLE 2

| Input of selector | | | |
|---|---|---|---|
| Input terminal | Data | Selection signal | Output of elector |
| 000 | 1 | 001 | |
| 001 | 1 | ("1") | 1 |
| 010 | 1 | | |
| 011 | 1 | | |
| 100 | 1 | | |

On the other hand, a signal shown in FIG. 2(b) indicates a case in which the clock and the output data are both shifted in phase (by 2 bits) from the signal of FIG. 2(a) because of jitters.

In this case, edge timing by which the clock becomes "H" from "L" is in a position of a bit number "3", while timing of a signal changing point by which the output data becomes "H" from "L" is in a position of a bit number "2" (heavy line portion in the drawing). Accordingly, for example, level data of "0001" ("H" from position of bit number "3") is obtained by the clock side flip-flops 21b to 21e excluding that for the initial value, and this data is input to the edge selector 23. In the edge selector 23, level data is input through the first AND circuit 24 to the selectors 27a to 27d, and level data of "0001" ("H" from position of bit number "3") is output.

Then, the level data "0001" is encoded as timing data (e.g., "011") indicating a bit number "3" by the encoder 28 (see Table 1).

For the output data, for example, level data of "0011" ("H" from position of bit number "2") is obtained by the flip-flops 21b to 21e, excluding that for the initial value, of the time interpolator 20 of the output data side, and this data is input to each input terminal of the selector 30. Then, in the selector 30 of the output data side, data of an input terminal corresponding to a bit number "3" is selected based on a selection signal ("011") input from the clock side. As a result, data output from the selector 30 becomes "H" as in the case of FIG. 2(a). Table 3 shows a relation between the output data input to the input terminal of the selector 30 of the output data side and the selection signal.

TABLE 3

| Input of selector | | | |
|---|---|---|---|
| Input terminal | Data | Selection signal | Output of selector |
| 000 | 0 | 011 | |
| 001 | 0 | ("3") | |
| 010 | 1 | | |
| 011 | 1 | | 1 |
| 100 | 1 | | |

Thus, in both cases of FIGS. 2(a) and 2(b), "H" is obtained as measurement data while jitters cause a fluctuation in signal changing point.

Figure 9:
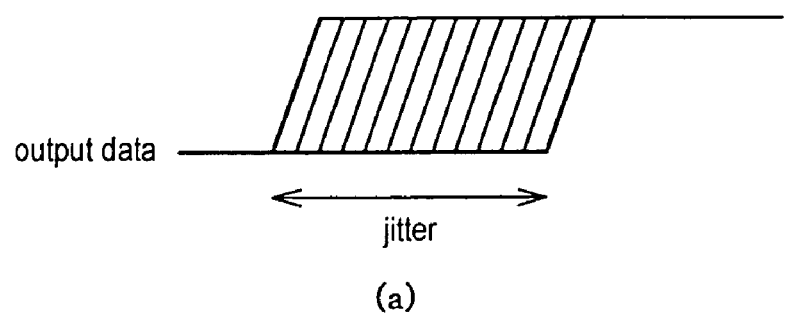
FIGS. 9(a) and 9(b) are signal views showing output data of a device under test in the conventional semiconductor test apparatus.
Figure 9:
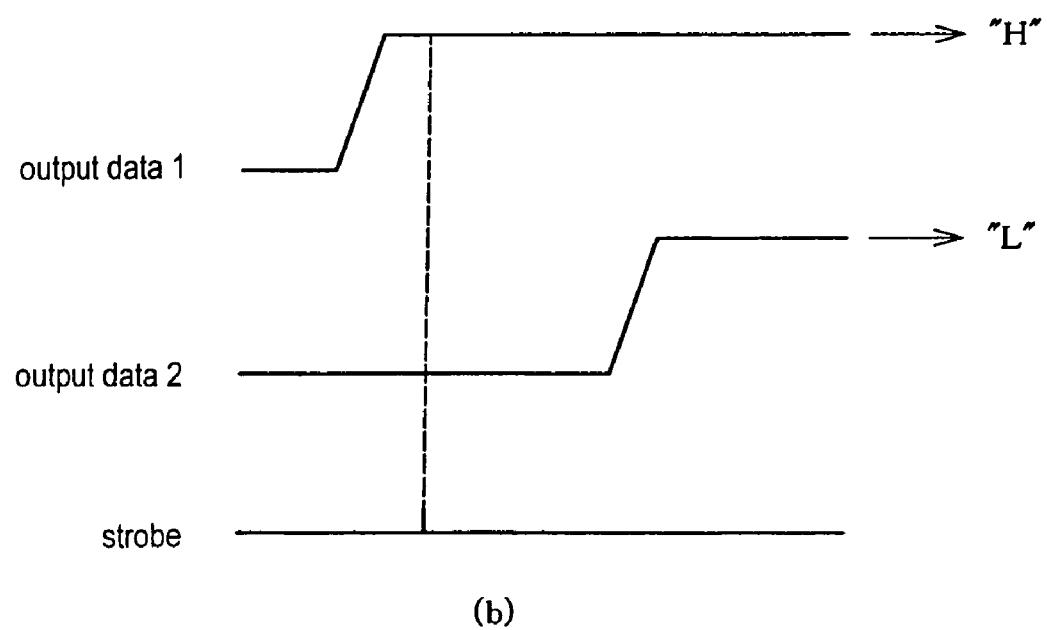

If the data is obtained in the conventional fixed strobe test apparatus, "H" is obtained in the case of FIG. 2(a), and "L" is obtained in the case of FIG. 2(b). In consequence, measurement data is not constant (see FIGS. 9(a) and 9(b)).

Thus, in the test apparatus of the embodiment, even when jitters cause fluctuations in signal changing point (edge timing) of the clock and the output data of the DUT 1, same results always can be obtained if the clock and the output data are shifted in phase.

The aforementioned basic operation is similar in the case of obtaining output data at timing of a clock falling edge. In this case, output data side level data of a bit number "4" of the flip-flops 21b to 21e excluding that for the initial value is obtained by clock level data of a bit number "4" output through the second AND circuits 25a to 25d and the selectors 27a to 27d of the edge selector 23 of the clock side.

Table 4 shows a relation between a falling edge position of a clock and outputs of the flip-flops 21a to 21d including that for the initial value, the edge selector 23, and the encoder 28.

TABLE 4

| Position of clock edge | Output of FF (including initial value) | Output of edge selector | Output of encoder |
|---|---|---|---|
| "No edge" | 00000 | 0000 | 100 |
| "0" | 10000 | 1000 | 000 |
| "1" | 11000 | 0100 | 001 |
| "2" | 11100 | 0010 | 010 |
| "3" | 11110 | 0001 | 011 |
| "No edge" | 11111 | 0000 | 100 |

Thus, in the case of obtaining the output data by the timing of the clock falling edge, level data output from the edge selector 23 is similar to that of the rising edge.

In the case of obtaining output data at timing of both rising and falling edges of a clock, outputs of the first and second AND circuits 24, 25 are obtained by the OR circuits 26a to 26d of the edge selector 23 of the clock side. Thus, as in the case of the aforementioned basic operation, it is possible to obtain output data at timing of both rising and falling edges of the clock of the DUT 1.

[Switching of Edge Selectors]

Next, referring to FIGS. 3(a) to 3(c), an embodiment of switching in the edge selector 23 will be described. FIGS. 3(a) to 3(c) are signal views when output data are obtained by switching clock edge timing of the DUT 1: rising edge of FIG. 3(a), falling edge of FIG. 3(b), and rising and falling edges of FIG. 3(c). In the example shown in FIGS. 3(a) to 3(c), as in the case of the basic operation shown in FIGS. 2(a) and 2(b), output data is obtained by a strobe of a bit number "4". Needless to say, however, the bit number of the strobe can be arbitrarily changed.

First, in the case of obtaining output data at timing of a rising edge of a clock for the SDR type device, selection signals of the selectors 27a to 27n of the edge selector 23 are switched to select an output of the first AND circuit 24 (Edge Sel=Rise Edge)

Accordingly, output data of the DUT 1 is obtained by rising edge timing of the clock of the DUT 1. In the example shown in FIG. 3(a), output data are obtained at timing of a position "1" of a bit number "0 to 3" at a first cycle and at timing of a position of a bit number "2" at a second cycle, and compared with a predetermined expectation value.

Next, in the case of obtaining output data at timing of a falling edge of a clock for the SDR type device, selection signals of the selectors 27a to 27n of the edge selector 23 are switched to select an output of the second AND circuit 25 (Edge Sel=Fall Edge).

Accordingly, output data of the DUT 1 is obtained by falling edge timing of the clock of the device under test. In the example shown in FIG. 3(b), output data are obtained at timing of a position "1" of a bit number "0 to 3" at a first cycle and at timing of a position of a bit number "2" at a second cycle, and compared with a predetermined expectation value.

It is to be noted that in the example shown in FIG. 3(b), output timing of a strobe is delayed from that shown in FIG. 3(a) in accordance with the falling edge timing of the clock.

Further, in the case of obtaining output data at timing of both rising and falling edges of a clock for the DDR type device, selection signals of the selectors 27a to 27n of the edge selector 23 are switched to select an output of the OR circuit 26 (Edge Sel=Both Edge).

Accordingly, output data of the DUT 1 is obtained at timing of both rising and falling edges of the clock of the DUT 1. In the example shown in FIG. 3(c), output data are obtained at timing of "1" of a bit number "0 to 3" of a clock rising edge at a first cycle, and at timing of a position of a bit number "1" of a falling edge at a second cycle.

Similarly, output data are obtained at timing of a bit number "2" of a clock rising edge at a third cycle, and at timing of a position of a bit number "2" of a falling edge at a fourth cycle. Thus, output data of the DDR type device can be obtained at timing of the DDR.

It is to be noted that in the example shown in FIG. 3(c), a strobe output frequency is twice as large as that in the case of the SDR (cases of FIGS. 3(a), 3(b)) in accordance with a frequency of the DDR.

[Detailed Operation of SDR]

Next, referring to FIGS. 4(a) to 4(c), description will be made of a detailed operation when output data of the SDR type device is obtained. FIGS. 4(a) to 4(c) are signal views when output data is obtained at timing of a rising edge of a clock of the SDR type DUT 1. In an example shown in FIGS. 4(a) to 4(c), output data is obtained by an 8-bit strobe of a bit number "0 to 7". Needless to say, however, the bit number of the strobe can be arbitrarily changed.

First, as shown in FIG. 4(a), when a clock normally operates, as in the case of the aforementioned basic operation (see FIGS. 2(a), 2(b) and FIG. 3(a)), output data of the DUT 1 is obtained at timing of a rising edge of the clock of the DUT 1. In the example shown in FIG. 4(a), output data are obtained at timing of a position "1" of a bit number "0 to 7" at a first cycle, and at timing of a position of a bit number "2" at a second cycle, and compared with a predetermined expectation value.

Next, when the clock does not normally operate because of jitters, states become as shown in FIGS. 4(b), 4(c).

First, as shown in FIG. 4(b), if the clock is shifted to a first-half cycle, a clock rising edge cannot be obtained at a second cycle. Accordingly, for example, an output of the edge selector 23 becomes "ALL 0" indicating "NO EDGE" (see Table 1), and the encoder 28 outputs a full-scale (overflow) signal as a selection signal of the selector 30.

In the example shown in FIG. 4(b), at a second cycle at which a rising edge cannot be obtained, output data is obtained at timing of a position of a last bit "7" as a full scale. As a result, comparison with an expectation value becomes "Non-coincidence (Fail)".

Similarly, if the clock is shifted to a second-half cycle, as shown in FIG. 4(c), since a clock rising edge cannot be obtained at a second cycle, output data is obtained at timing of a position of a last bit "7" as a full scale. As a result, comparison with an expectation value becomes "Non-coincidence (Fail)".

It is to be noted that when the clock is shifted and the encoder 28 outputs a full-scale signal, an error is immediately determined, whereby "Failure (Fail)" can be uniformly determined without comparing the output data obtained in the last bit position with an expectation value.

The case of obtaining the output data by the clock rising edge for the SDR type device has been described. A case of obtaining output data by a clock falling edge is carried out as in the aforementioned case by switching edge select signals of the edge selector 23.

[Detailed Description of DDR]

Next, referring to FIGS. 5(a) to 5(c) and FIGS. 6(a) to 6(c), description will be made when output data of the DDR type device is obtained. FIGS. 5(a) to 5(c) and FIGS. 6(a) to 6(c) are signal views when output data is obtained at timing of both rising and falling edges of a clock of the DDR type DUT 1: FIGS. 5(a) to 5(c) showing a case in which there is an expectation value in a clock, and FIGS. 6(a) to 6(c) showing a case in which there is no expectation value in a clock.

In examples shown in the drawings, output data is obtained by a 4-bit strobe of a bit number "0 to 3". Needless to say, however, the bit number of the strobe can be arbitrarily changed.

[Case in Which There is Clock Expectation Value]

As shown in FIGS. 5(a) to 5(c), when there is an expectation value set in the clock of the DUT 1, a clock signal is also input as data to the selector 30 of the clock side, obtained at timing of rising and falling edges of the clock, and compared with the clock expectation value. Accordingly, if the clock is shifted, clock data is obtained and compared with the expectation value, whereby a pass/failure can be determined without referring to the output data side.

First, as shown in FIG. 5(a), the clock data is obtained at timing of rising and falling edges of the clock, and compared with a clock expectation value, i.e., a High value at a first half of each cycle and a Low value of a second half. If the clock normally operates, determination based on the clock expectation value is always "Coincidence (Pass)", and thus output data is obtained.

For acquisition of output data, as in the case of the aforementioned basic operation (see FIGS. 2(a), 2(b) and FIG. 3(c)), output data of the DUT 1 is obtained at timing of both rising and falling edges of a clock of the DUT 1. In the example shown in FIG. 5(a), output data are obtained at timing of a position "1" of a bit number "0 to 3" for both rising and falling edges of a clock at first and second cycles, and compared with a predetermined expectation value.

Similarly, output data are obtained at timing of a position of a bit number "2" for a rising edge of a clock at a third cycle, and at timing of a position of a bit number "1" for a falling edge of a clock at a fourth cycle, and compared with an expectation value.

Next, if the clock does not normally operate because of jitters, as shown in FIGS. 5(b), 5(c), clock data is obtained at edge timing of the clock, and compared with a clock expectation value, and a failure is detected.

First, as shown in FIG. 5(b), if the clock is shifted to a first-half cycle, a clock falling edge is obtained at a third cycle. In this case, clock data=L is obtained in a position of a bit number "2" indicating a clock falling position, and compared with an expectation value=H of a first-half cycle of the clock. Thus, a result of determining a pass/failure becomes "failure (Fail)".

Similarly, a clock rising edge is obtained at a fourth cycle. In this case, clock data=H is obtained in a position of a bit position "1" indicating a clock rising position, and compared with an expectation value=L of a second-half cycle of the clock. Thus, a result of determining a pass/failure becomes "failure (Fail)".

Accordingly, in this case, "failure (Fail)" which disables acquisition of output data is determined.

On the other hand, if the clock is shifted to a second-half cycle, as shown in FIG. 5(c), a clock edge is not obtained at a third cycle. Thus, clock data=L is obtained in a position of a last bit "3" as full-scale data, and compared with an expectation value=H of a first-half cycle of the clock. Thus, a result of determining a pass/failure becomes "failure (Fail)".

At a fourth cycle, a clock rising edge is obtained. In this case, clock data=H is obtained in a position of a bit number "2" indicating a clock rising position, and compared with an expectation value=L of a second-half cycle of the clock. Thus, a result of determining a pass/failure becomes "failure (Fail)".

Thus, in this case, no output data is obtained, and "failure (Fail)" is determined.

[Case in Which There is No Clock Expectation Value]

If there is no expectation value in a clock, as in the case of the basic operation (FIGS. 2(a), 2(b) and FIG. 3(c)) and the detailed operation of the SDR (FIGS. 4(a) to 4(c)) described above, output data obtained at timing of clock rising and falling edges is compared with a predetermined expectation value for output data, whereby a pass/failure is determined.

While detailed description is omitted, a signal in this case becomes as shown in FIGS. 6(a) to 6(c).

FIG. 6(a) shows a case in which a clock normally operates, FIG. 6(b) shows a case in which a clock is shifted to a first-half cycle, and FIG. 6(c) shows a case in which a clock is shifted to a second-half cycle.

As described above, according to the semiconductor test apparatus of the embodiment, by disposing the source synchronous circuit which comprises the time interpolator 20 including the edge selector 23, and the selection circuit 30, the clock and the output data output from the DUT 1 can be obtained as the time-sequential level data. The time-sequential level data indicates edge timing which is a signal changing point of the clock (or output data) of the DUT 1. Thus, by obtaining the level data indicating this clock edge timing, it is possible to use the level data as a timing signal for obtaining the output data of the DUT 1.

Especially, according to the embodiment, by disposing the edge selector 23, the time-sequential level data obtained by the plurality of strobes at the time interpolator 20 can be selectively output as level data indicating timing of the rising edge, the falling edge or both rising and falling edges.

Accordingly, even when jitters cause a fluctuation in signal changing point (rising or falling edge) of the clock and the output data of the DUT 1, it is possible to fetch the output data at timing of the changed clock edge.

Especially, since the output data can be fetched by the timing of the rising edge, the falling edge or both rising and falling edges of the clock, not only the SDR type device but also the DDR type device can be dealt with.

Thus, the semiconductor test apparatus of the embodiment can obtain output data at timing changed in accordance with jitters for all types of device under tests, always obtain an accurate testing result without being influenced by jitters, and is particularly suitable for testing a high-speed DDR semiconductor device.

Needless to say, the foregoing embodiment is in no way limitative of the semiconductor test apparatus of the present invention, and various changes can be made within the scope of the invention.

For example, the embodiment has been described by way of the case of front edge detection regarding the clock edge detection. However, the embodiment can be applied to a case of rear edge detection.

FIGS. 7(a) and 7(b) are signal views showing a difference of clock edge detection between front edge detection and rear edge detection: FIG. 7(a) showing the front edge detection, and FIG. 7(b) showing the rear edge detection.

As shown, the front edge detection is a method of setting an edge detected first among desired edges detected at a test cycle as timing data (encode data) of a clock side for obtaining output data.

On the other hand, the rear edge detection is a method of setting an edge detected last among the desired edges detected at the test cycle as timing data (encode data) of the clock side for obtaining the output data.

According to the invention, the output data can be obtained by desired clock edge timing in both of the front edge detection of the embodiment and the rear edge detection shown in FIG. 7(b). Thus, it is possible to realize a good effect of the invention that the device under test can be accurately tested without being influenced by jitters.

INDUSTRIAL APPLICABILITY

As described above, according to the semiconductor test apparatus of the present invention, the source synchronous circuit is provided, whereby the clocks and the output data output from the device under test are obtained as the time-sequential level data and the output data of the device under test can be fetched by the timing of the rising edge, the falling edge or both rising and falling edges of the clock signal output from the device under test. Thus, it is possible to realize a semiconductor test apparatus which can fetch output data at a signal changing point synchronized with jitters, and obtain an accurate testing result irrespective of jitters, and can be suitably used especially for testing a DDR type device which outputs data by both rising and falling edges of a clock as data rates.

The invention claimed is:

1. A semiconductor test apparatus characterized by comprising:
a first time interpolator to which clocks output from a device under test are input and which obtains the clocks by a plurality of strobes having constant timing intervals and which outputs the clocks as time-sequential level data;
a second time interpolator to which output data output from the device under test are input and which obtains the output data by a plurality of strobes having constant timing intervals and which outputs the output data as time-sequential level data; and
a first selection circuit which receives the time-sequential level data output from the first and second time interpolators, thereby selecting the output data input to the second time interpolator at edge timing of the clocks input to the first time interpolator, and outputting the selected data as measurement data of the device under test,
the first and/or second time interpolator being equipped with an edge selector to which the time-sequential level data obtained by the plurality of strobes are input and which selectively outputs level data indicating timing of rising edges and/or falling edges of the level data.

2. The semiconductor test apparatus according to claim 1, further comprising a second selection circuit which receives the time-sequential level data output from the first time interpolator, thereby selecting the clocks input to the first time interpolator at edge timing of the clocks input to the first time interpolator, and outputting the selected clocks as clock data of the device under test.

3. The semiconductor test apparatus according to claim 1, wherein the first time interpolator comprises:
   a plurality of sequential logic circuits to which the clocks output from the device under test are input;
   a delay circuit which sequentially inputs strobes delayed at constant timing intervals to the plurality of sequential logic circuits and which outputs the time-sequential level data from the sequential logic circuits;
   an edge selector to which the time-sequential level data output from the plurality of sequential logic circuits are input and which outputs level data indicating a rising edge, level data indicating a falling edge, or level data indicating rising and falling edges among the time-sequential level data obtained by inputting the clocks of the device under test; and
   an encoder to which the level data output from the edge selector is input and which encodes the level data as timing data indicating edge timing of the clocks of the device under test and which outputs the timing data.

4. The semiconductor test apparatus according to claim 1, wherein the second time interpolator comprises:
   a plurality of sequential logic circuits to which the output data output from the device under test are input; and
   a delay circuit which sequentially inputs strobes delayed at constant timing intervals to the plurality of sequential logic circuits and which outputs the time-sequential level data from the sequential logic circuits.

5. The semiconductor test apparatus according to claim 4, wherein the second time interpolator comprises:
   an edge selector to which the time-sequential level data output from the plurality of sequential logic circuits are input and which outputs level data indicating a rising edge, level data indicating a falling edge, or level data indicating rising and falling edges among the time-sequential level data obtained by inputting the output data of the device under test; and
   an encoder to which the level data output from the edge selector is input and which encodes the level data as timing data indicating edge timing of the output data of the device under test and which outputs the timing data.

6. The semiconductor test apparatus according to claim 3, wherein the edge selector comprises:
   one or more selector circuits comprising:
      a first AND circuit to which an inverted output of one sequential logic circuit and a non-inverted output of a next-stage sequential logic circuit are input,
      a second AND circuit to which a non-inverted output of one sequential logic circuit and an inverted output of a next-stage sequential logic circuit are input,
      an OR circuit to which outputs of the first and second AND circuits are input, and
      a selector which selects one of outputs of the first and second AND circuits and the OR circuits.

7. The semiconductor test apparatus according to claim 1, wherein the first selection circuit comprises:
   a selector which selects one data among the time-sequential level data input from the second time interpolator by using the time-sequential level data encoded by the first time interpolator as selection signals and which outputs the selected data as measurement data of the device under test.

8. The semiconductor test apparatus according to claim 2, wherein the second selection circuit comprises:
   a selector which selects one data among the time-sequential level data input from the first time interpolator by using the time-sequential level data encoded by the first time interpolator as selection signals and which outputs the selected data as clock data of the device under test.

9. The semiconductor test apparatus according to claim 1, further comprising a bus which interconnects the first and second time interpolators and which distributes data output from the first and second time interpolators to predetermined selection circuits.

* * * * *